United States Patent
Takahashi et al.

(10) Patent No.: US 10,766,238 B2
(45) Date of Patent: Sep. 8, 2020

(54) METHOD OF MANUFACTURING MULTILAYER SUBSTRATE

(71) Applicant: DENSO CORPORATION, Aichi-pref (JP)

(72) Inventors: Yoshihito Takahashi, Toyota (JP); Daisuke Ito, Toyota (JP)

(73) Assignee: DENSO CORPORATION, Kariya, Aichi-Pref. (JP)

( * ) Notice: Subject to any disclaimer, the term of this patent is extended or adjusted under 35 U.S.C. 154(b) by 56 days.

(21) Appl. No.: 16/152,824

(22) Filed: Oct. 5, 2018

(65) Prior Publication Data

US 2019/0118520 A1    Apr. 25, 2019

(30) Foreign Application Priority Data

Oct. 20, 2017 (JP) .................. 2017-203637

(51) Int. Cl.
*B32B 37/06* (2006.01)
*H05K 3/46* (2006.01)
(Continued)

(52) U.S. Cl.
CPC .............. *B32B 37/06* (2013.01); *B32B 27/08* (2013.01); *B32B 27/38* (2013.01); *B32B 37/182* (2013.01); *H05K 3/462* (2013.01); *H05K 3/4644* (2013.01); *B32B 2255/10* (2013.01); *B32B 2255/205* (2013.01); *B32B 2260/021* (2013.01); *B32B 2260/046* (2013.01); *B32B 2262/101* (2013.01); *B32B 2457/08* (2013.01);
(Continued)

(58) Field of Classification Search
CPC ... B32B 37/06; B32B 37/182; B32B 2457/08; H05K 3/462; H05K 3/4644; H05K 3/4638
See application file for complete search history.

(56) References Cited

U.S. PATENT DOCUMENTS 5,719,354 A * 2/1998 Jester .................. H05K 3/4617
174/255
5,939,789 A 8/1999 Kawai et al.
(Continued)

FOREIGN PATENT DOCUMENTS

JP       2579133 B2 *  2/1997
JP    2010-123901 A    6/2010
(Continued)

OTHER PUBLICATIONS

Machine translation of JP 2579133 date unknown.*
(Continued)

*Primary Examiner* — John L Goff, II
(74) *Attorney, Agent, or Firm* — Sughrue Mion, PLLC

(57) ABSTRACT

A method of manufacturing a multilayer substrate includes preparing a plurality of substrates, stacking the substrates with bonding sheets interposed, and a first bonding process of bonding the substrates to each other by partially heating the stacked substrates by a heater and partially melting the bonding sheet. Each of the substrates is provided with a through-hole and a metal film covering an inner peripheral surface of the through-hole. In the first bonding process, the metal film is heated by the heater and heat is transferred from the heater to the bonding sheet via the metal film.

5 Claims, 8 Drawing Sheets

(51) Int. Cl.
    *B32B 37/18*    (2006.01)
    *B32B 27/08*    (2006.01)
    *B32B 27/38*    (2006.01)
(52) U.S. Cl.
    CPC ... *H05K 3/4638* (2013.01); *H05K 2203/0195* (2013.01); *H05K 2203/068* (2013.01)

(56) References Cited

U.S. PATENT DOCUMENTS

| | | | |
|---|---|---|---|
| 6,159,586 A * | 12/2000 | Inoue | H01L 21/4857 428/209 |
| 2008/0100291 A1 | 5/2008 | Mayder | |
| 2013/0075137 A1* | 3/2013 | Weatherspoon | H05K 3/4614 174/255 |

FOREIGN PATENT DOCUMENTS

| | | |
|---|---|---|
| JP | 2016-189400 A | 11/2016 |
| WO | 2010070771 A1 | 6/2010 |

OTHER PUBLICATIONS

Merriam-Webster.com definition of "thermoplastic" Jan. 2020.*
Communication dated Mar. 28, 2019 from the European Patent Office in application No. 18199703.2.

* cited by examiner

METHOD OF MANUFACTURING MULTILAYER SUBSTRATE

INCORPORATION BY REFERENCE

The disclosure of Japanese Patent Application No. 2017-203637 filed on Oct. 20, 2017 including the specification, drawings and abstract is incorporated herein by reference in its entirety.

BACKGROUND

1. Technical Field

The present disclosure relates to a method of manufacturing a multilayer substrate.

2. Description of Related Art

Japanese Unexamined Patent Application Publication No. 2010-123901 (JP 2010-123901 A) discloses a method of manufacturing a multilayer substrate. The method includes a step of preparing a plurality of substrates, a step of stacking the substrates with bonding sheets interposed, and a step of bonding the substrates to each other by heating the stacked substrates by a heater to melt the bonding sheet. Each of the substrates is provided with a through-hole, and the melted bonding sheet flows into the through-hole, whereby the substrates are bonded to each other.

SUMMARY

In the method described above, the bonding sheet positioned between the substrates is melted by heating a region including the through-hole of the substrate. In this case, heat is transferred to the bonding sheet positioned between the substrates via the substrate, but heat is relatively not transferred to the substrate made of a resin material or the like. Therefore, in order to sufficiently melt the bonding sheet, it is needed to set a heating time by the heater to be relatively long, and consequently, the heat applied to the substrate is transferred to a wide range, and the bonding sheet is melted over a wider range than needed. The present disclosure provides a method of manufacturing a multilayer substrate for melting a bonding sheet positioned between substrates in a short amount of time.

An aspect of the present disclosure relates to a method of manufacturing a multilayer substrate. The method includes preparing a plurality of substrates, stacking the substrates with bonding sheets interposed, and a first bonding process of bonding the substrates to each other by partially heating the stacked substrates by a heater and partially melting the bonding sheet. Each of the substrates is provided with a through-hole and a metal film covering an inner peripheral surface of the through-hole. In the first bonding process, the metal film is heated by the heater and heat is transferred from the heater to the bonding sheet via the metal film.

In the method according to the aspect of the present disclosure, each of the substrates is provided with the through-hole and the metal film covering the inner peripheral surface of the through-hole. Therefore, it is possible to heat the bonding sheet positioned between the substrates via the metal film by heating the metal film by the heater. Since the thermal conductivity of the metal film is higher than that of the substrate, it is possible to locally heat the bonding sheet positioned between the substrates in a short amount of time. The heating time by the heater can be shortened since the bonding sheet can be melted in a short amount of time. Consequently, for example, it is possible to avoid melting the bonding sheet more than needed.

In the method according to the aspect of the present disclosure, the heater may have a heater head. In the first bonding process, the heated heater head may be brought into contact with a region including the through-hole of the substrate. With this configuration, it is possible to heat the bonding sheet via the metal film while the stacked substrates are pressurized. The specific configuration of the heater is not particularly limited, and the heater may be a non-contact type heater (for example, a heater that radiates a laser).

In the method according to the aspect of the present disclosure, the metal film may extend to the outside of the through-hole on both sides of the substrate. In the first bonding process, the metal film may be in contact with both the heater head and the bonding sheet. With this configuration, heat transfer from the heater head to the bonding sheet is efficiently performed.

In the method according to the aspect of the present disclosure, the heater head may be provided with a contact surface and a protruding portion protruding from the contact surface. In the first bonding process, when the heater head is brought into contact with the region including the through-hole, the contact surface may come into contact with the substrate or the metal film and the protruding portion may be disposed in the through-hole. With this configuration, it is possible to more effectively heat the metal film, and consequently, it is possible to melt the bonding sheet in a shorter time.

The method according to the aspect of the present disclosure may further include a second bonding process of bonding the substrates to each other by entirely pressing the stacked substrates with a pair of heating platens, and entirely melting the bonding sheet, after the first bonding process. With this configuration, primary bonding for fixing the substrates to each other is performed in the first bonding process, and thereafter, the substrates can be firmly bonded to form a multilayer substrate in the second bonding process.

In the method according to the aspect of the present disclosure, each of the substrates and the bonding sheets may be further provided with a positioning hole. The substrate and the bonding sheet may be alternately stacked while a positioning pin is inserted into the positioning hole when the substrates are stacked, and the first bonding process may be performed in a state where the substrates and the bonding sheet are supported by the positioning pin. As described above, positioning of each substrate can be performed with high accuracy.

In the method according to the aspect of the present disclosure, at least one of the number and arrangement of the through-holes may differ between at least two of the substrates. As described above, it is possible to freely provide through-holes in each of the substrates, and it is possible to reduce restrictions on wiring design.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
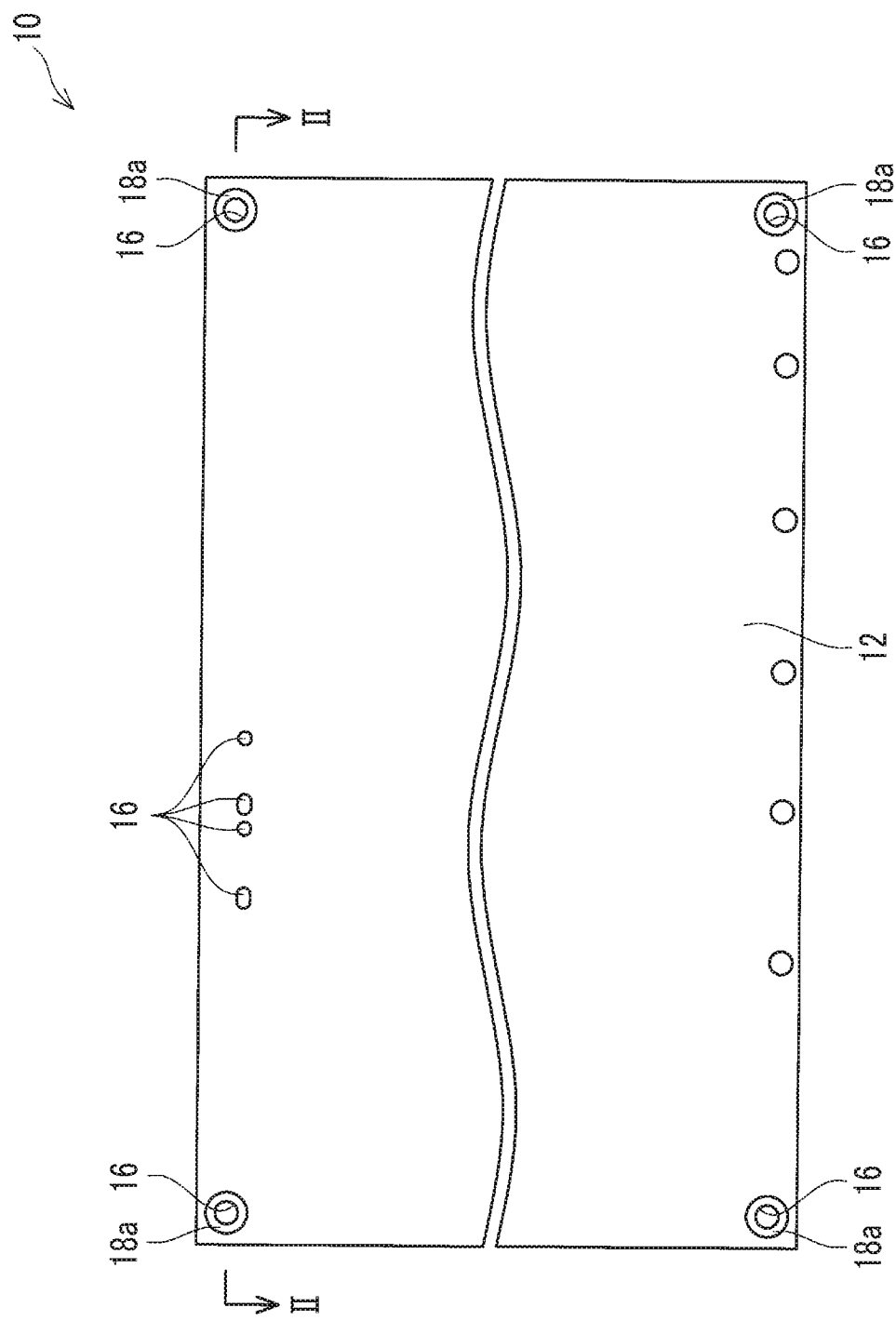
FIG. 1 a plan view illustrating a multilayer substrate according to an example.
Figure 2:
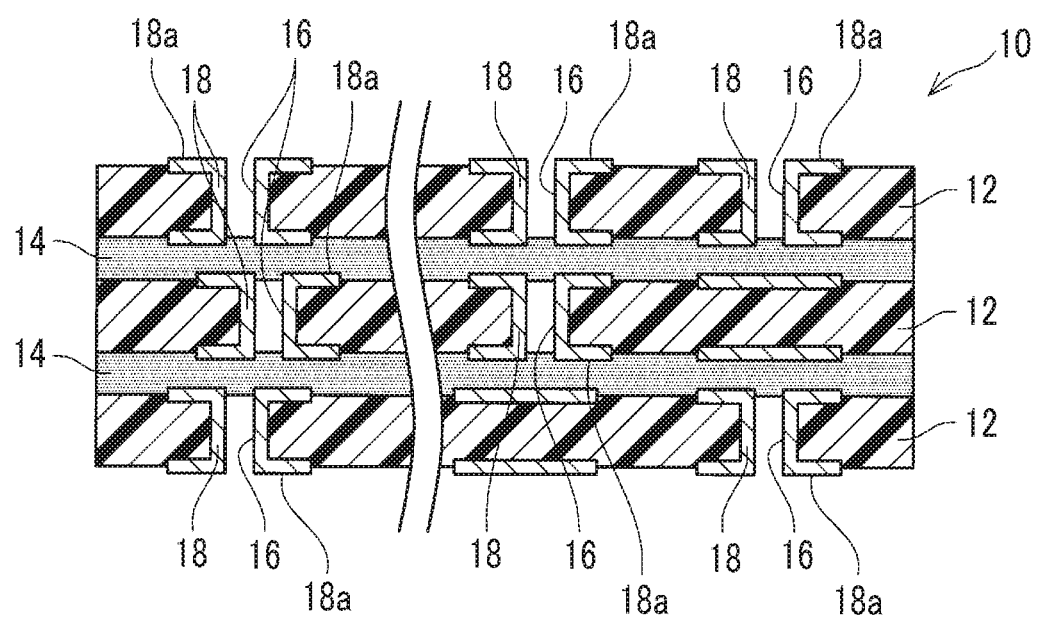
FIG. 2 is a cross-sectional view taken along line II-II in FIG. 1.

With reference to the drawings, a multilayer substrate 10 according to an example will be described. As shown in FIGS. 1 and 2, the multilayer substrate 10 includes a plurality of substrates 12. Various wiring patterns (partially not shown) including a plurality of lands and pads are printed on each of the substrates 12. The substrates 12 are stacked with bonding sheets 14 interposed. As an example, three substrates 12 are stacked in FIG. 2, but the number of stacked substrates 12 constituting the multilayer substrate 10 is not particularly limited. Each of the substrates 12 is provided with a plurality of through-holes 16. In the multilayer substrate 10, a wiring pattern provided on one surface of the substrate 12 is connected to a wiring pattern provided on the other surface through the through-hole 16.

As shown in FIGS. 1 and 2, the substrate 12 has a plate shape and is made of a material having insulating properties. For instance, the substrate 12 in the present example is made of a resin material such as glass epoxy. A thickness dimension of the substrate 12 is not particularly limited, and may be, for example, about 0.4 mm to 1.6 mm. The wiring pattern to be formed on the substrate 12 may be printed on one side or both sides of the substrate 12.

The bonding sheet 14 is also referred to as a resin sheet or a prepreg. A material constituting the bonding sheet 14 is not particularly limited, and any material may be used as long as the material has insulating properties and bonds adjacent substrates 12 to each other when heat is applied. For instance, the bonding sheet 14 in the present example is made of a resin material such as glass epoxy. A thickness dimension of the bonding sheet 14 is not particularly limited, and may be, for example, about 50 μm to 250 μm per one sheet. The bonding sheet 14 may be a single sheet or may be formed by stacking a plurality of sheets.

A metal film 18 covering an inner peripheral surface of the through-hole 16 is provided in the through-hole 16. In the present example, the through-hole 16 is formed in a hole shape, but the shape is not particularly limited, and may be formed in a groove shape along a side surface of the substrate 12. A material constituting the metal film 18 may be a material having a thermal conductivity higher than that of the resin material, and examples of the material include a metal material such as copper. For instance, the thermal conductivity of the resin is 0.4 W/m·K and the thermal conductivity of copper is 396 W/m·K. A thickness dimension of the metal film 18 may be, for example, about 20 μm to 30 μm. A diameter dimension of the through-hole 16 including the metal film 18 may be, for example, about 1.0 mm. The metal film 18 covering the inner peripheral surface of the through-hole 16 may extend to the outside of the through-hole 16 on both sides of the substrate 12, and may form, for example, a land portion 18a.

Figure 3:
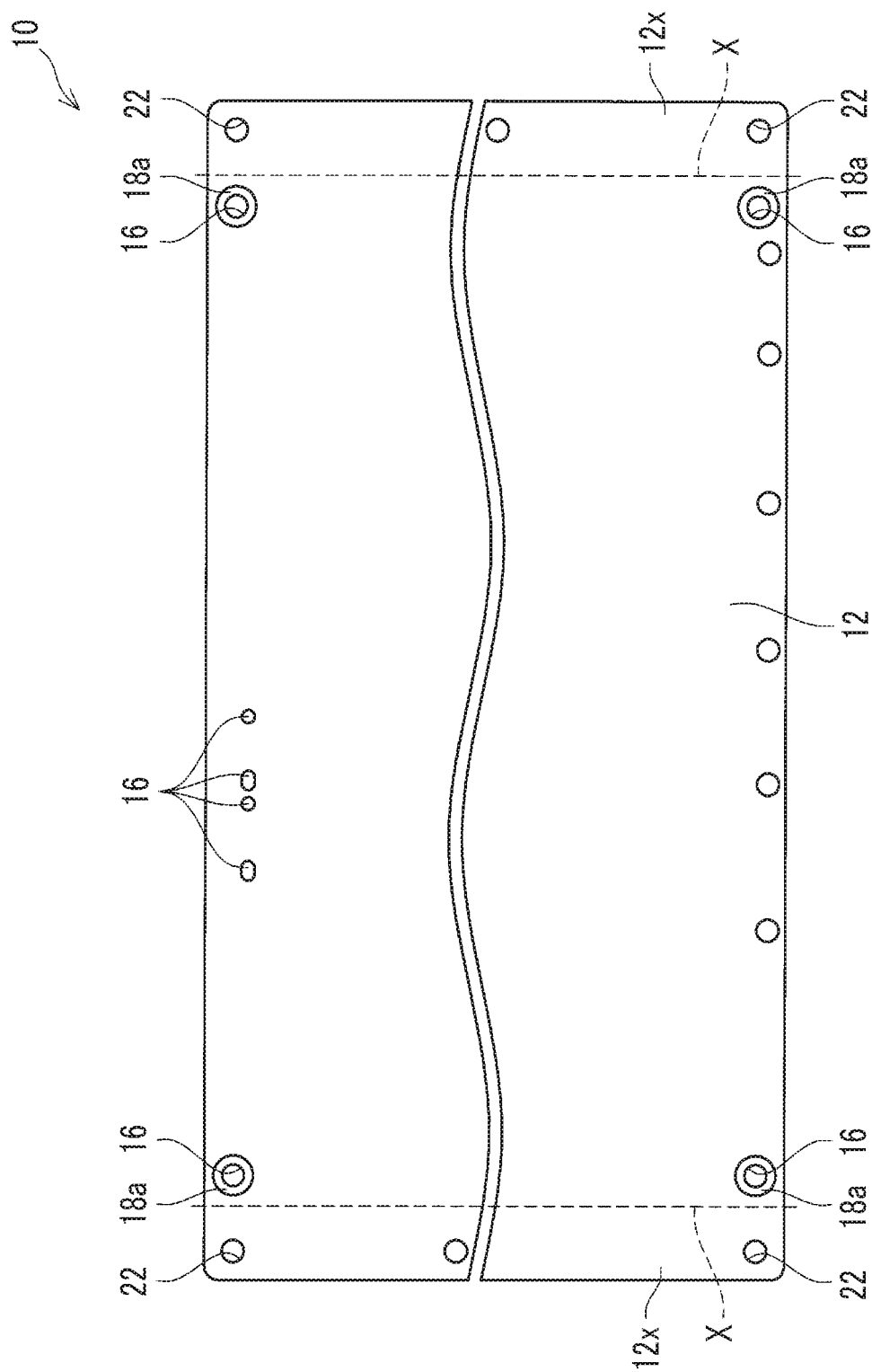
FIG. 3 is a plan view illustrating a substrate.

With reference to FIGS. 3 to 7, a method of manufacturing the multilayer substrate 10 of the example will be described. First, the substrates 12 and the bonding sheets 14 are prepared. In the preparation step, as shown in FIG. 3, margin portions 12x are provided at both end portions of the substrate 12. The margin portion 12x is cut off at a cutting line X after a third step described later. The margin portion 12x is provided with a positioning hole 22. This configuration is also adopted in the bonding sheet 14, and a positioning hole 24 is provided in the margin portion (see FIG. 4).

Figure 4:
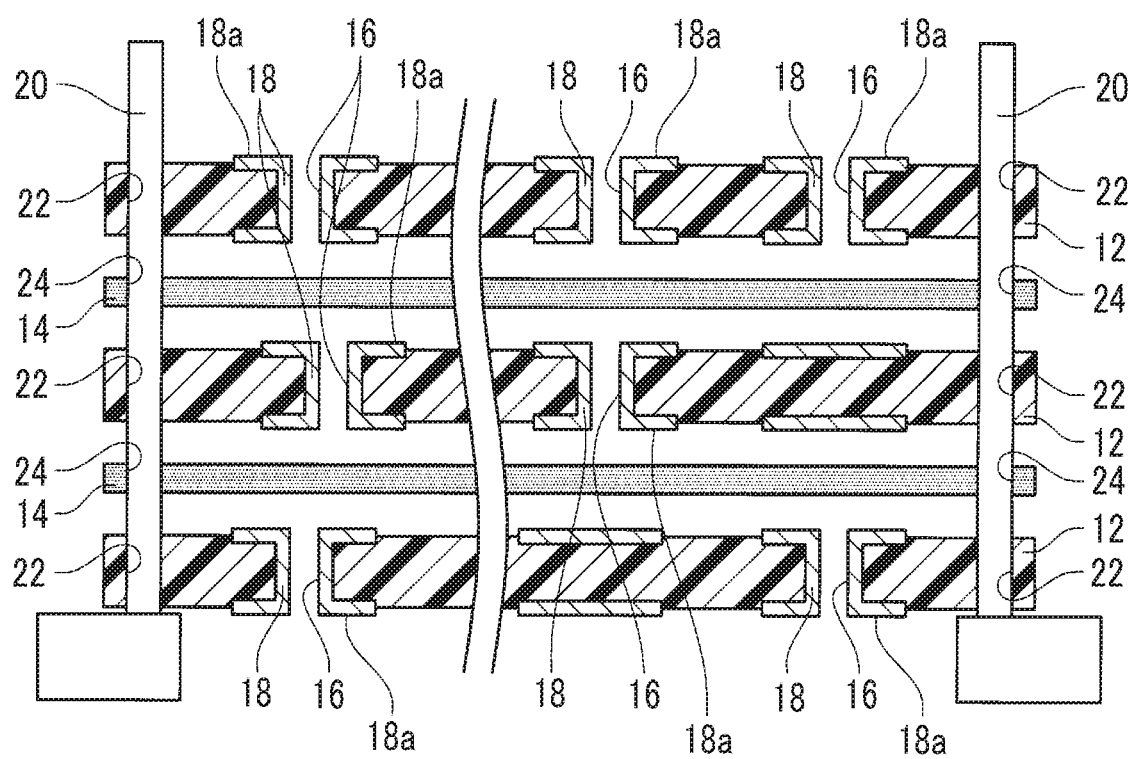
FIG. 4 is a view illustrating a method of manufacturing a multilayer substrate, which indicates a positioning step of stacking a plurality of substrates with bonding sheets interposed (first step)

In a first step, as shown in FIG. 4, the substrates 12 are positioned to be stacked with the bonding sheets 14 interposed. In the first step, the substrate 12 and the bonding sheet 14 are alternately stacked while positioning pins 20 are inserted through the positioning holes 22, 24 of the substrate 12 and the bonding sheet 14. As described above, positioning of each substrate can be performed with high accuracy. At this time, a first bonding step to be described later may be performed in a state in which the substrate 12 and the bonding sheet 14 are supported by the positioning pins 20.

Figure 5:
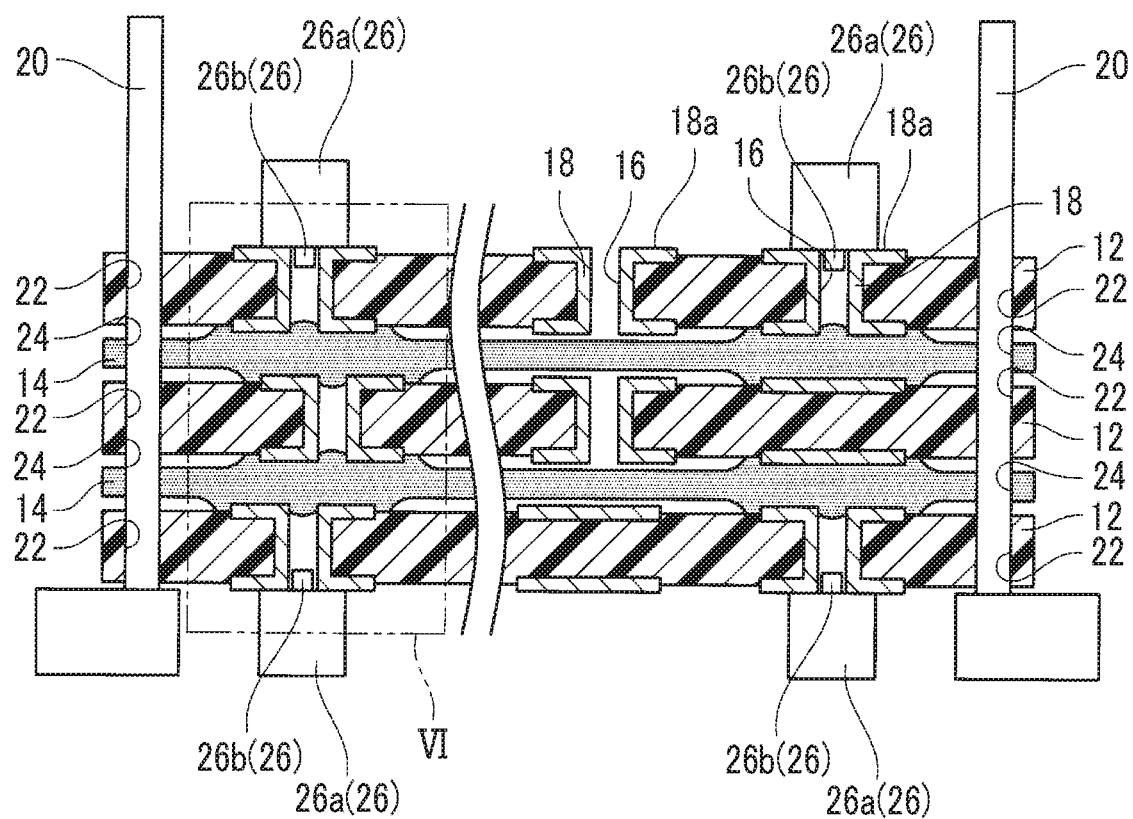
FIG. 5 is a view illustrating the method of manufacturing the multilayer substrate, which indicates a first bonding step of heating a region including a through-hole of a substrate by a heater and partially melting the bonding sheet (second step)
Figure 6:
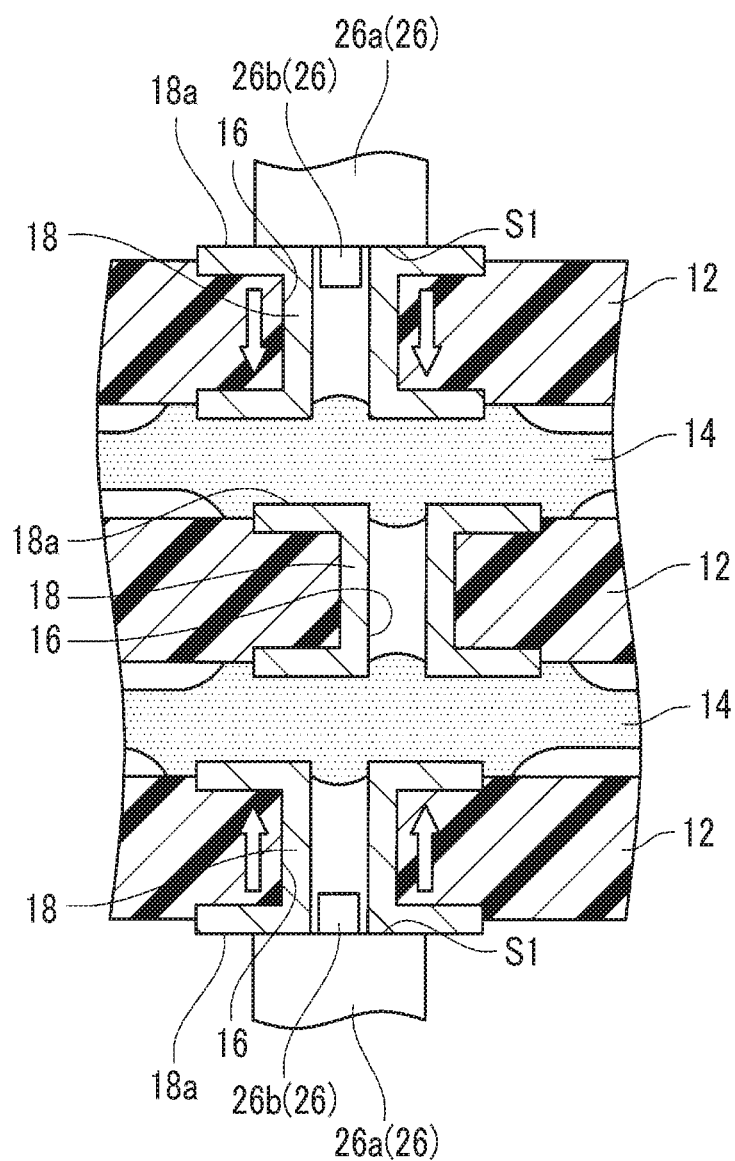
FIG. 6 is an enlarged view of a VI portion in FIG. 5.

In the second step, as shown in FIGS. 5 and 6, the first bonding step is performed in which a region including the through-hole 16 of the substrate 12 is heated by a heater 26 and the bonding sheet 14 is partially melted. The metal film 18 covering the inner peripheral surface of the through-hole 16 is provided in the through-hole 16 of the substrate 12. Therefore, when the metal film 18 is heated by the heater 26, the heat from the heater 26 is transferred to the bonding sheet 14 through the metal film 18. That is, the heater 26 can heat the bonding sheet 14 positioned between the substrates 12 via the metal film 18. Since the thermal conductivity of the metal film 18 is higher than that of the substrate 12, it is possible to locally heat the bonding sheet 14 positioned between the substrates 12 in a short amount of time. At this time, the heat is transferred in the direction of arrows in FIG. 6. Since the bonding sheet 14 can be melted in a short amount of time, a heating time by the heater 26 can be shortened, and, for example, it is possible to avoid melting the bonding sheet 14 more than needed.

For instance, the heater 26 used in the present example has a heated heater head 26a, and in the first bonding step, the heated heater head 26a is brought into contact with the region including the through-hole 16 of the substrate 12. With this configuration, the bonding sheet 14 can be heated via the metal film 18 while the stacked substrates 12 are pressurized. The specific configuration of the heater 26 is not particularly limited, and as another example, the heater 26 may be a non-contact type (for example, the heater 26 that radiates a laser).

The heater head 26a may be provided with a contact surface S1 and a protruding portion 26b protruding from the contact surface S1. In the first bonding step, when the heater head 26a is brought into contact with the region including the through-hole 16, the contact surface S1 may come into contact with the substrate 12 or the metal film 18, and the protruding portion 26b may be disposed in the through-hole 16. With this configuration, the metal film 18 can be more effectively heated, and consequently, the bonding sheet 14 can be melted in a shorter time.

As described above, the metal film 18 may extend to the outside of the through-hole 16 on both sides of the substrate 12 to form the land portion 18a. In the first bonding step, the metal film 18 may be in contact with both the heater head 26*a* and the bonding sheet 14. With this configuration, heat is efficiently transferred from the heater head 26*a* to the bonding sheet 14. By adopting the technique of the present disclosure, it is possible to use the through-hole 16 of a component such as a land printed on the substrate 12 without extra processing. Therefore, it is not needed to separately provide the through-hole 16 for bonding, and the space for the substrate 12 can be saved.

In the first bonding step, for instance, the heater head 26*a* can be pressed and bonded to the region including the through-hole 16 of the substrate 12. As exemplified bonding conditions, pressing may be performed until the bonding sheet 14 reaches 140° C. or higher with a pressing pressure of 10 N to 20 N and a temperature of the heater 26 of 320° C.

Figure 7:
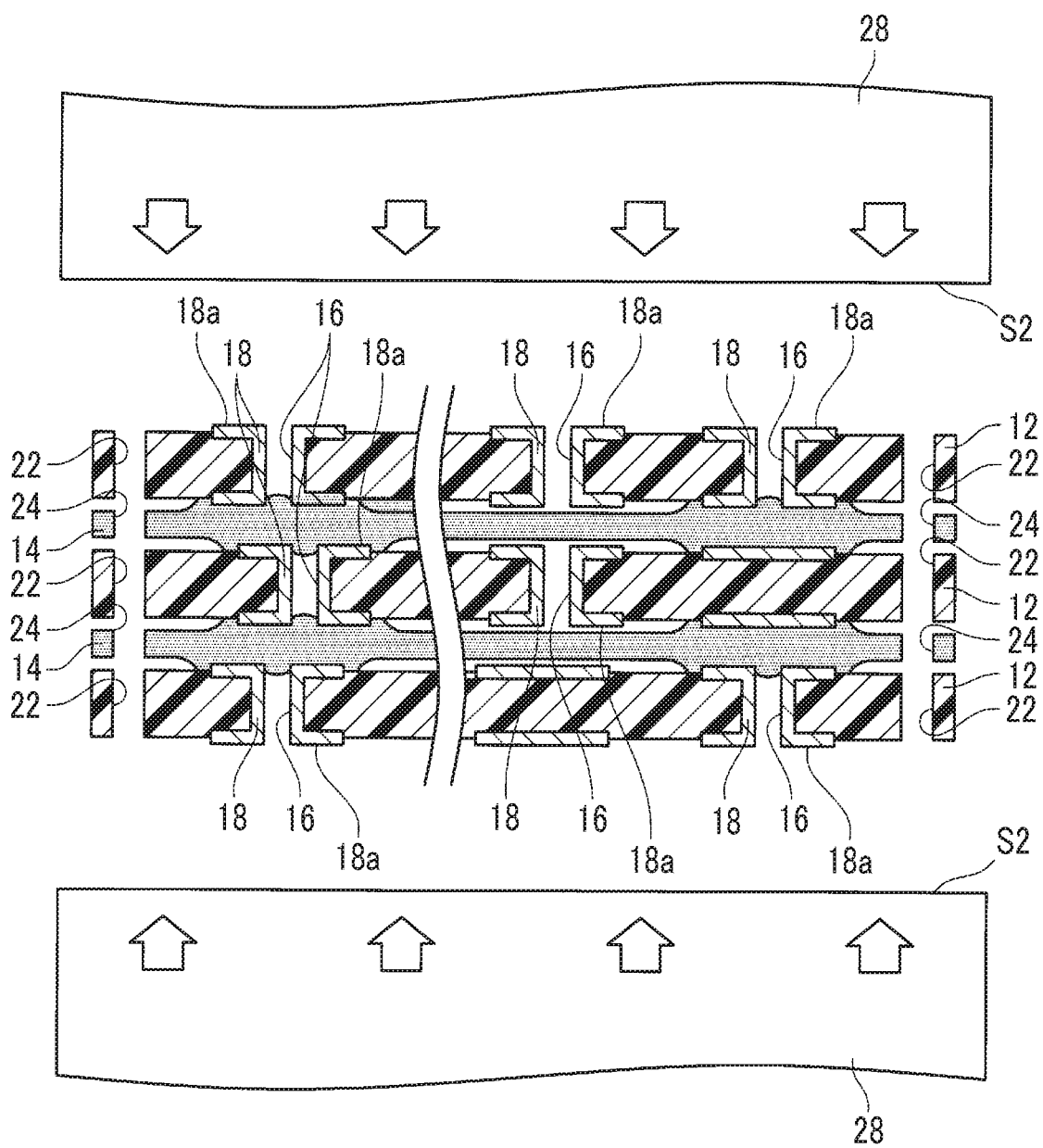
FIG. 7 is a view illustrating the method of manufacturing the multilayer substrate, which indicates a second bonding step of pressing the stacked substrates with a heating platen in a vertical direction and melting the entire bonding sheet (third step)

In the third step, as shown in FIG. 7, the substrates 12 stacked in the second step are pressed with a pair of upper and lower heating platens 28 (in a direction of arrows in FIG. 7) and the entire bonding sheets 14 are melted, thereby performing a second bonding step of bonding the substrates 12 to each other. Each of the heating platens 28 has a sufficiently wide pressing surface S2, and it is possible to press while evenly heating the entire substrate 12. With this configuration, primary bonding for fixing the substrates 12 to each other is performed in the first bonding step, and thereafter, the substrates 12 are firmly bonded to form the multilayer substrate in the second bonding step. For instance, the second bonding step can be performed by hot pressing under vacuum or under reduced pressure. In this case, as an exemplified press condition, it is desirable to perform a two-step press-forming including a first press with a pressure of 0.3 MPa and a second press with a pressure of 3.0 MPa, at a set temperature of 220° C. In this case, a duration of performing the first press and a duration of performing the second press are not particularly limited, and may respectively be, for example, 2.5 minutes.

Finally, though not necessarily a needed step, when the margin portions of the substrate 12 and the bonding sheet 14 of the multilayer substrate (the portions from the cutting line X to the end portion in FIG. 3 including the positioning holes 22, 24) are removed, the multilayer substrate 10 is completed. In the manufacturing method in which the technique of the present disclosure as described above is adopted, the through-hole 16 is not formed in the already-produced multilayer substrate, and the multilayer substrate 10 can be manufactured by using the substrate 12 with the through-hole 16 provided in advance. Consequently, at least one of the number or arrangement of the through-holes 16 can differ between at least two of the substrates 12. As described above, it is possible to freely provide the through-holes 16 in each of the substrates 12, and it is possible to reduce restrictions on wiring design.

Figure 8:
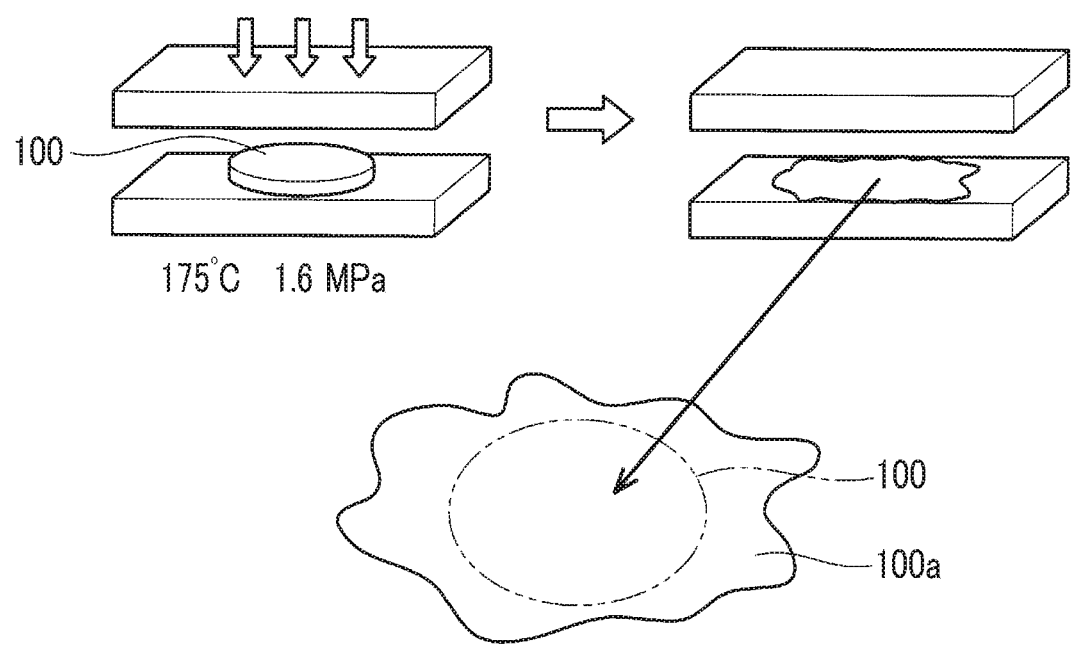
FIG. 8 is a view illustrating a method of measuring a flow amount of a material constituting the bonding sheet.

The bonding conditions in the present example will be described. Heating temperature in the first bonding step may be set such that the bonding sheet 14 reaches 140° C. or higher. Furthermore, considering a heat transfer rate, the temperature of the heater 26 is not particularly limited, and may be set to 300° C. or higher. In the present example, the bonding sheet 14 having a flow amount of 30% or less is adopted. The flow amount referred to here is an index indicating fluidity and is measured by the following method. That is, as shown in FIG. 8, a sample 100 of the bonding sheet 14 is pressed at a pressure of 1.6 MPa while being heated to 175° C. At this time, a weight ratio of a flowing portion 100*a* flowing from an original shape to a peripheral side is the flow amount.

The press condition for press-forming the multilayer substrate can be variously changed. As described above, the press condition adopted in the present example is employed in two-step press-forming including the first press with the pressure of 0.3 MPa and the second press with the pressure of 3.0 MPa, at the set temperature of 220° C., and the duration of the first press and the duration of the second press each are 2.5 minutes. As an alternative press condition, while lowering the set temperature to 190° C., the duration of the second press with the pressure of 3.0 MPa may be extended to 7.5 minutes. The aforementioned press condition is a press condition for high-speed forming that enables press-forming in a short amount of time, but it is possible to form a multilayer substrate even under the press conditions as described above.

Alternatively, instead of the aforementioned press condition for high-speed forming, a series of press conditions as follows may be adopted. Under the press condition, first, the temperature is raised from room temperature at a rate of 3° C./min while a pressure of 0.8 MPa is applied. When the temperature reaches 80° C., the state is maintained for 15 minutes. Next, the temperature is raised from 80° C. at a rate of 2.5° C./min, and in a state where the temperature reaches 110° C., the pressure is increased to 3.0 MPa. Finally, when the temperature reaches 180° C., the state is maintained for 45 minutes. The multilayer substrate can also be formed under the press conditions as described above.

While some specific examples have been described in detail above, these are merely illustrative and do not limit the scope of claims. The techniques described in the claims include those in which the specific examples exemplified above are variously modified and changed. The technical elements described in this specification or the drawings exert technical usefulness singly or in various combinations.

What is claimed is:

1. A method of manufacturing a multilayer substrate, the method comprising:
   preparing a plurality of substrates;
   stacking the substrates with bonding sheets interposed; and
   a first bonding process of bonding the substrates to each other by partially heating the stacked substrates by a heater and partially melting the bonding sheets, wherein:
   each of the substrates is provided with a through-hole and a metal film covering an inner peripheral surface of the through-hole; and
   in the first bonding process, the metal film on an outermost substrate is heated by the heater and heat is transferred from the heater to the bonding sheet adjacent the outermost substrate via the metal film, wherein:
   the heater has a heater head;
   in the first bonding process, the heated heater head is brought into contact with a region including the through-hole of the outermost substrate,
   the heater head is provided with a contact surface and a protruding portion protruding from the contact surface; and
   in the first bonding process, when the heater head is brought into contact with the region including the through-hole, the contact surface comes into contact with the substrate or the metal film, and the protruding portion is disposed in the through-hole.

2. The method according to claim 1, wherein:
   the metal film extends to the outside of the through-hole on both sides of the substrate; and in the first bonding process, the metal film on the outermost substrate is in contact with both the heater head and the bonding sheet adjacent the outermost substrate.

3. The method according to claim 1, further comprising a second bonding process of bonding the substrates to each other by entirely pressing the stacked substrates with a pair of heating platens, and entirely melting the bonding sheets, after the first bonding process.

4. The method according to claim 1, wherein:
   each of the substrates and the bonding sheets is further provided with a positioning hole; and
   when the substrates are stacked, the substrate and the bonding sheet are alternately stacked while a positioning pin is inserted into the positioning hole, and the first bonding process is performed in a state where the substrates and the bonding sheets are supported by the positioning pin.

5. The method according to claim 1, wherein at least one of a number and an arrangement of the through-holes differs between at least two of the substrates.

\* \* \* \* \*